United States Patent [19]
Mahler et al.

[11] Patent Number: 5,429,705
[45] Date of Patent: Jul. 4, 1995

[54] APPARATUS FOR COATING AND/OR ETCHING SUBSTRATES IN A VACUUM CHAMBER

[75] Inventors: Peter Mahler, Hainburg; Wolfgang Stang, Kefenrod, both of Germany

[73] Assignee: Leybold Aktiengesellschaft, Hanau, Germany

[21] Appl. No.: 160,923

[22] Filed: Dec. 1, 1993

[30] Foreign Application Priority Data

Feb. 25, 1993 [DE] Germany .................. 43 05 748.9

[51] Int. Cl.⁶ .................................................. C23F 1/02
[52] U.S. Cl. ................................... 156/345; 134/33; 216/37
[58] Field of Search ............... 156/345, 639, 643; 134/33

[56] References Cited

U.S. PATENT DOCUMENTS

| | | | |
|---|---|---|---|
| 4,221,652 | 9/1980 | Kuriyama | 204/298 |
| 4,388,140 | 6/1983 | Nakazato et al. | 156/639 |
| 4,422,896 | 12/1983 | Class et al. | 156/643 |
| 5,038,713 | 8/1991 | Kawakami et al. | 156/345 |
| 5,211,794 | 5/1993 | Enomoto et al. | 156/639 |
| 5,225,057 | 7/1993 | Le Febvre et al. | 204/192.13 |
| 5,236,548 | 8/1993 | Stadler et al. | 156/639 |
| 5,246,528 | 9/1993 | Hasegawa et al. | 156/639 |
| 5,298,111 | 3/1994 | Hasegawa et al. | 156/639 |
| 5,310,430 | 5/1994 | McCall, Jr. | 134/33 |

FOREIGN PATENT DOCUMENTS

| | | |
|---|---|---|
| 0207801 | 1/1987 | European Pat. Off. |
| 0516436 | 12/1992 | European Pat. Off. |
| 225451 | 7/1985 | German Dem. Rep. |
| 9114253 | 1/1992 | Germany. |
| 0037581 | 3/1979 | Japan .......... 156/639 |
| 0068633 | 5/1980 | Japan .......... 156/345 |
| 4167425 | 6/1992 | Japan .......... 156/345 |

OTHER PUBLICATIONS

IBM Technical Disclosure Bulletin, Guggenheim, et al., vol. 20, No. 6, Nov. 1977.

N.N.: Elektronik Produktion & Prüftechnik, Sep. 1985, pp. 586–587, figure 16.

*Primary Examiner*—Olik Chaudhuri
*Assistant Examiner*—Long Pham

[57] ABSTRACT

Apparatus for the coating and etching of substrates in a vacuum chamber (4), includes a cathode (17, 17') having a target (18, 18'), and a rotatable structure (8) shaped as an essentially cylindrical hollow body having circular disk-shaped end faces provided with pivot shafts (10, 10') held for rotation about a horizontal axis (r) in bearings (11, 11') disposed on the side walls (12, 12') of the vacuum chamber (4). Mountings (19, 19') for holding the substrates in place are provided on the circumference of the hollow body, the cathode (17, 17') and the etching anode (16) being disposed opposite the rotatable structure (8) in a plane (E) running horizontally and approximately in the plane of the axis of rotation (r).

14 Claims, 6 Drawing Sheets

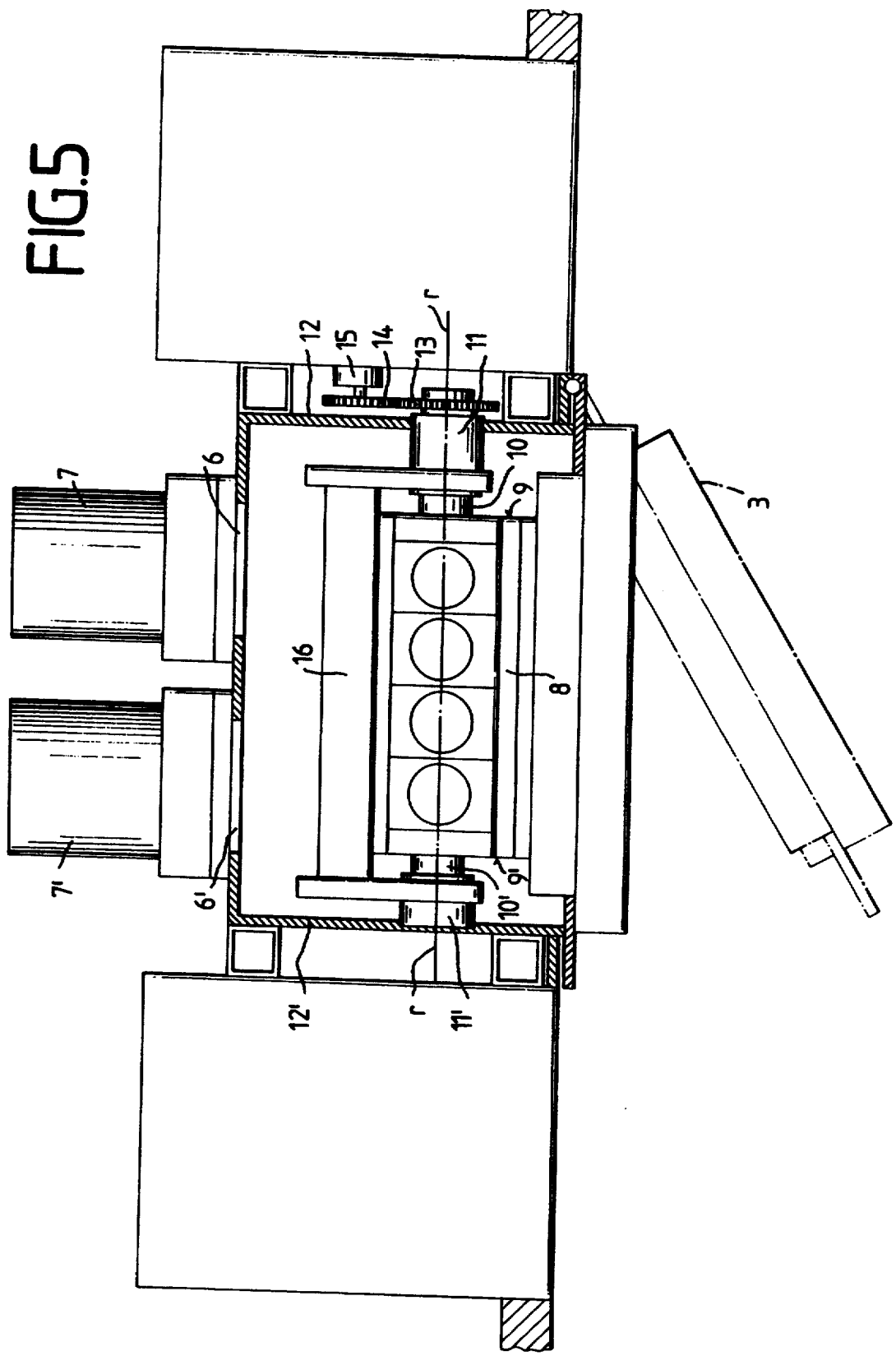

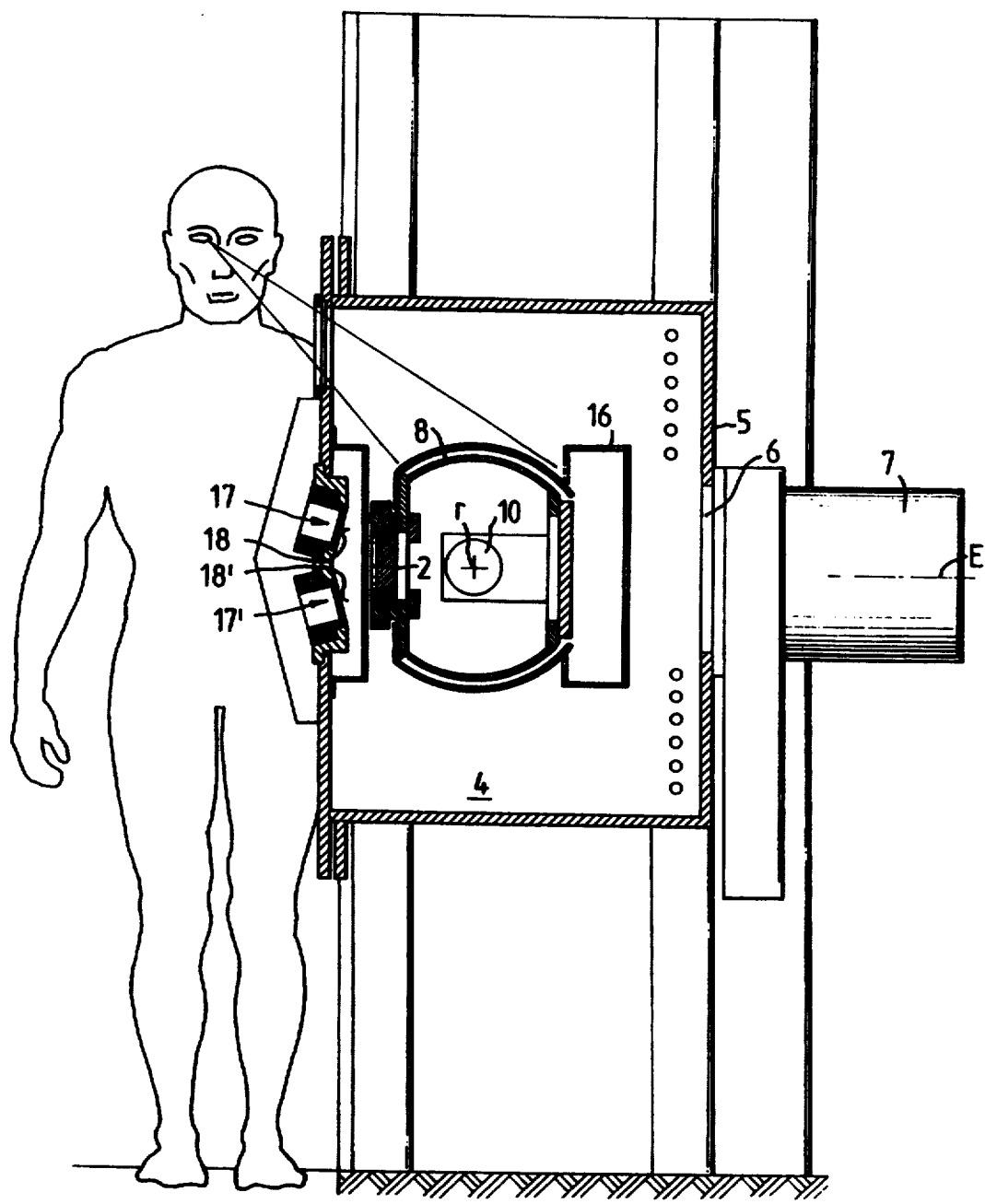

APPARATUS FOR COATING AND/OR ETCHING SUBSTRATES IN A VACUUM CHAMBER

BACKGROUND OF THE INVENTION

The invention relates to an apparatus for coating and/or etching substrates in a vacuum chamber, having a coating source, for example a cathode bearing a target or an etching anode and a rotatable structure that can be moved in relation to the coating source, a substrate holder on said structure, and a power supply system. A suitable substrate holder is disclosed in U.S. Pat. No. 5,350,455.

U.S. Pat. No. 4,422,896 describes apparatus in which the substrates are disposed on a polygonal body which is mounted on the cover of the vacuum chamber. It is only with difficulty that the substrates can be fastened on the substrate holder and removed therefrom.

DD 225 451 A1 discloses a positioning drive for the angular etching of substrates, especially semiconductor wafers. The drive is disposed in a vacuum chamber of a dry etching apparatus, is connected with a substrate plate holding the substrates, and moves the substrate plate, which is integrated in a substrate holder, into an etching position from 0° to 90° in the high vacuum. The substrate holder assumes additional airlocking and treatment positions successively in a linear direction of movement, while on the portion of the substrate holder that is not adjustable for the etching angle the pivoting substrate plate is mounted on a pivot shaft. At right angles to the pivot shaft of the substrate plate a plate is disposed which contains a cam track. An element for the transmission of a rotatory movement is fixed to the pivot shaft and is in driving engagement with an additional transmission element rotatably disposed on the part of the substrate holder that is not adjustable for the etching angle, and it has at a distance from its axis of rotation an element which engages the cam track of the plate. The cam track is so configured that the substrate plate, upon the movement of the substrate holder in the area of the etching position, is turned at an angle of 0° and 90° to the axis of the ion source, while the center of the substrate surface always maintains its position in the ion stream in the greatest variety of etching positions.

This known apparatus has the disadvantage of being extremely complicated in construction and therefore very much liable to give trouble.

SUMMARY OF THE INVENTION

The present invention is addressed to an apparatus for coating and etching substrates, in which a rotatable structure for the substrate holder is so disposed in the interior of the vacuum chamber and is so configured that the substrate holder is especially convenient to use, and the actual treatment process is to take place with the substrate surfaces in the vertical position. Furthermore, degradation of the quality of the coated surfaces by glitter particles landing on the substrates is prevented. Lastly, the cathode and anode arrangement is especially easy to maintain and the exchange of targets is effortlessly possible.

In accordance with the invention the rotatable structure is configured as an essentially cylindrical hollow body whose end face is provided with a pivot shaft journaled for rotation about a horizontal axis in a bearing disposed on the side wall of the vacuum chamber. Mountings are provided for clamping the substrates on the outside of the hollow body, preferably in a row which parallels the pivoting axis of the substrate holder. The cathodes and the etching anodes are disposed on opposite sides of the substrate holder in a plane extending horizontally through the axis of rotation of the structure.

BRIEF DESCRIPTION OF THE DRAWINGS

FIG. 5 is a plan view of the coating apparatus of FIG. 1 in a section through the vacuum chamber in a plane above the substrate holder.

FIG. 6 is a section view taken transversely through the coating apparatus with the substrate holder in the sputter coating position.

DETAILED DESCRIPTION OF THE PREFERRED EMBODIMENT

Figure 1:
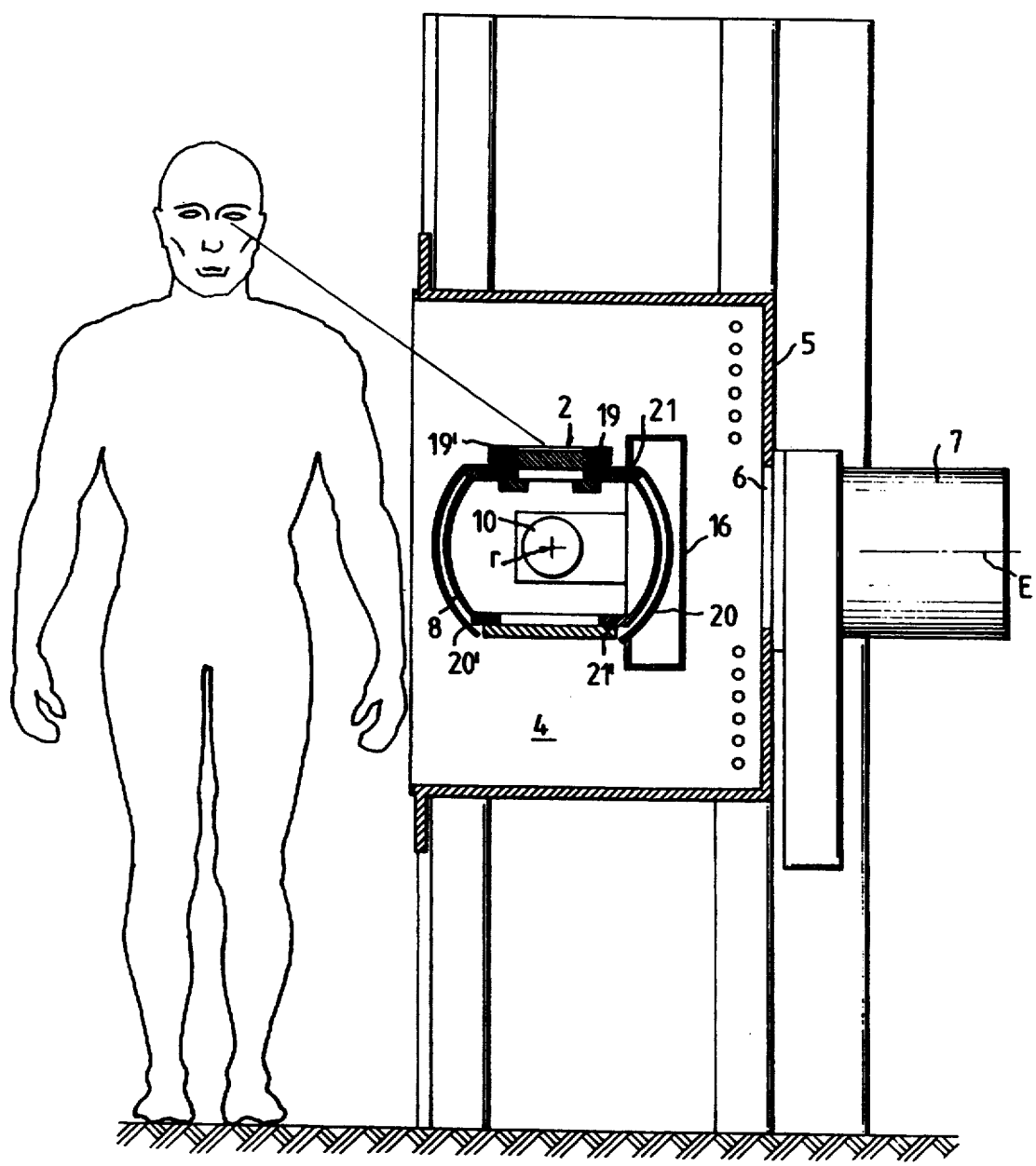
FIG. 1 is a section taken transversely through the coating apparatus with the housing door open and a substrate holder in the service position.

The apparatus for coating substrates consists essentially of the following: the vacuum chamber 4 with a door 3, the back wall 5 of the chamber provided with openings 6, 6' attached to the suction connections of vacuum pumps 7, 7', and a drum-like rotatable structure 8 forming a hollow cylindrical body whose end walls 9, 9' are provided with pivot shafts 10, 10' journaled in bearings 11, 11'. The pivot shaft 10 extends through the one side wall 12 of the vacuum chamber 4 and is connected via gears 13, 14 to a motor-powered drive unit 15. An anode plate (box-shaped anode) 16 is mounted on the shells of bearings 11, 11' for rotation on the axis r.

Figure 2:
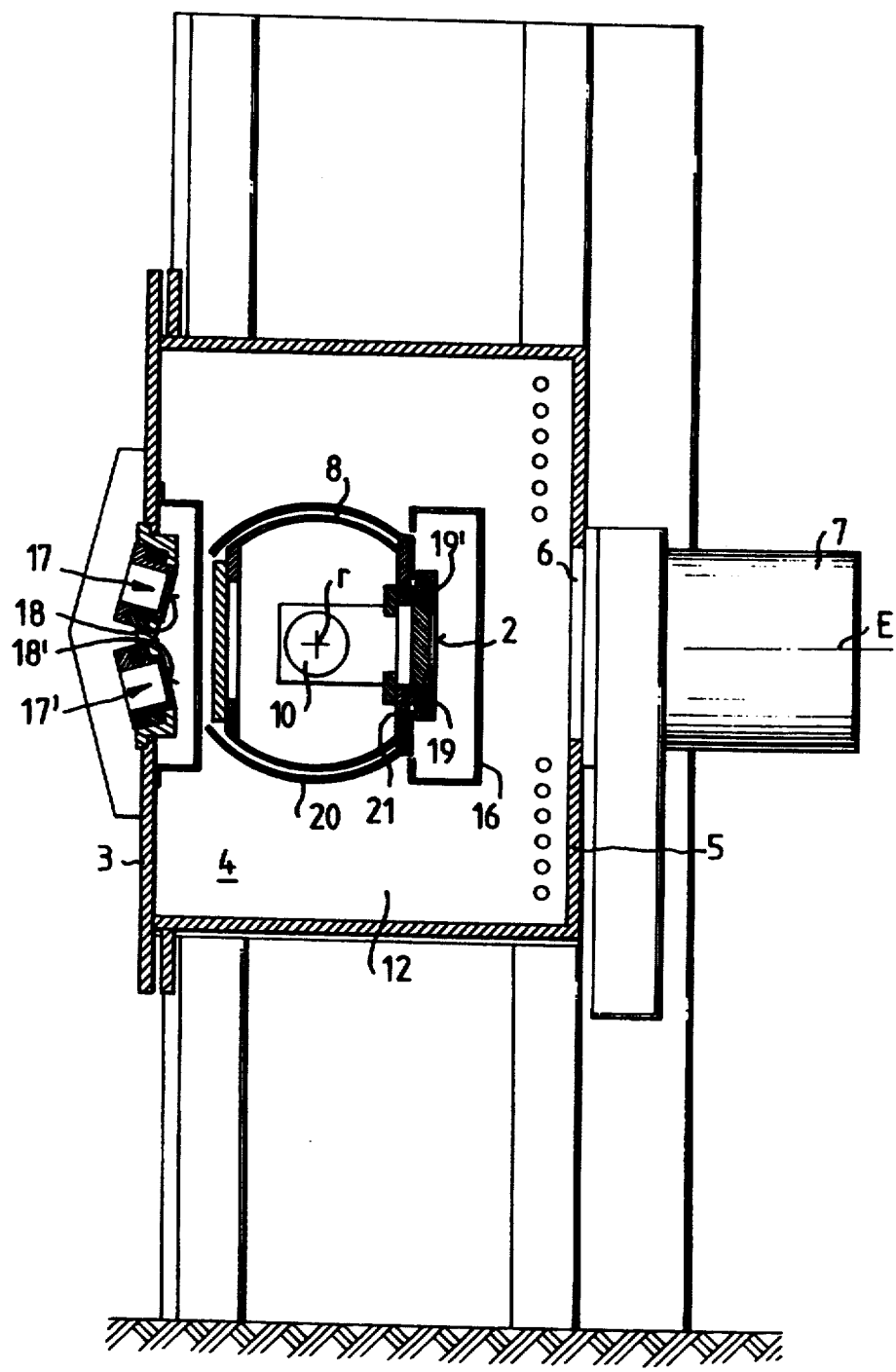
FIG. 2 is a section taken transversely through the coating apparatus but with the housing door closed and the substrate holder in the etching position.
Figure 3:
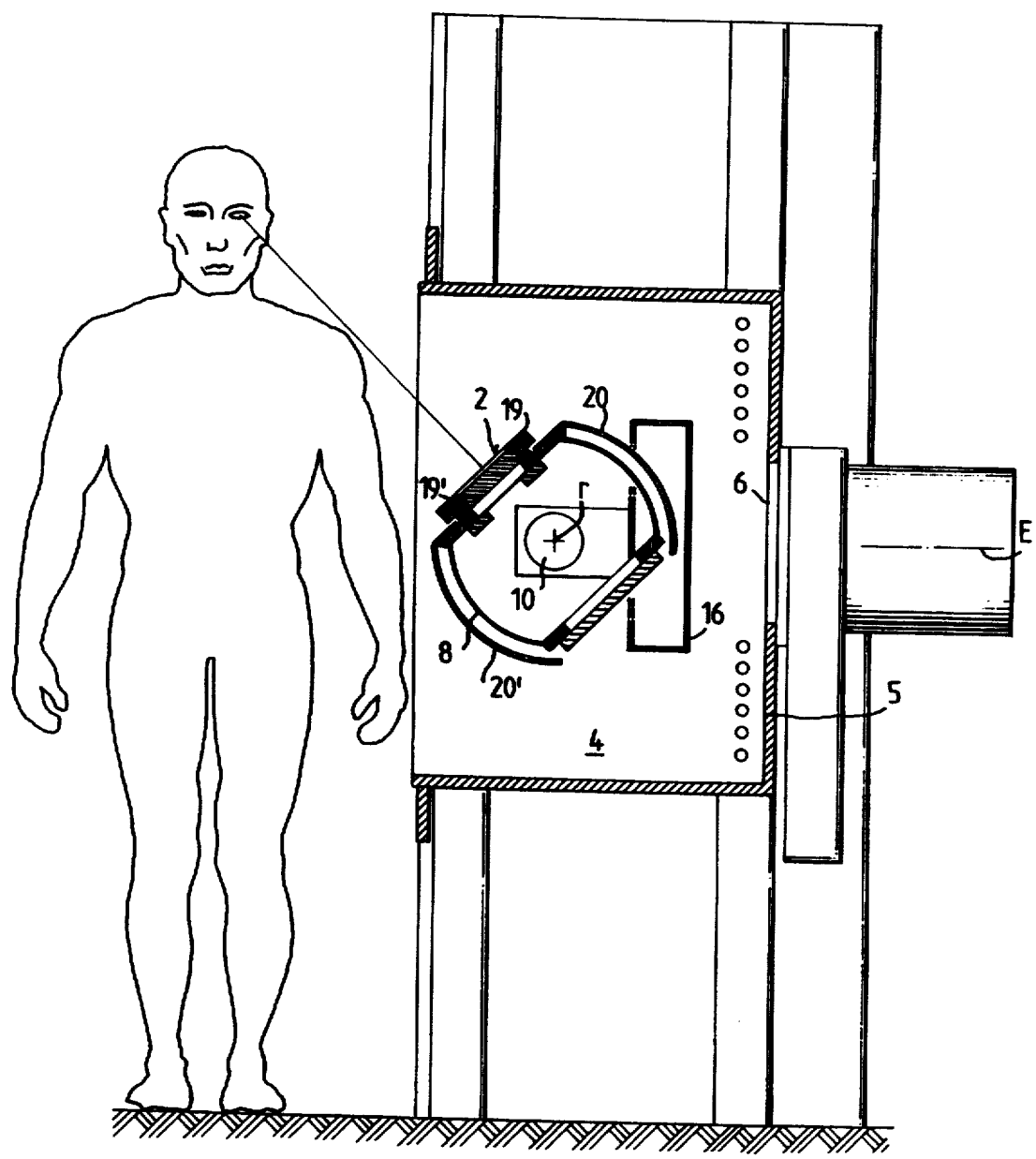
FIG. 3 is a section taken transversely through the coating apparatus with the substrate holder in the inspection position.
Figure 4:
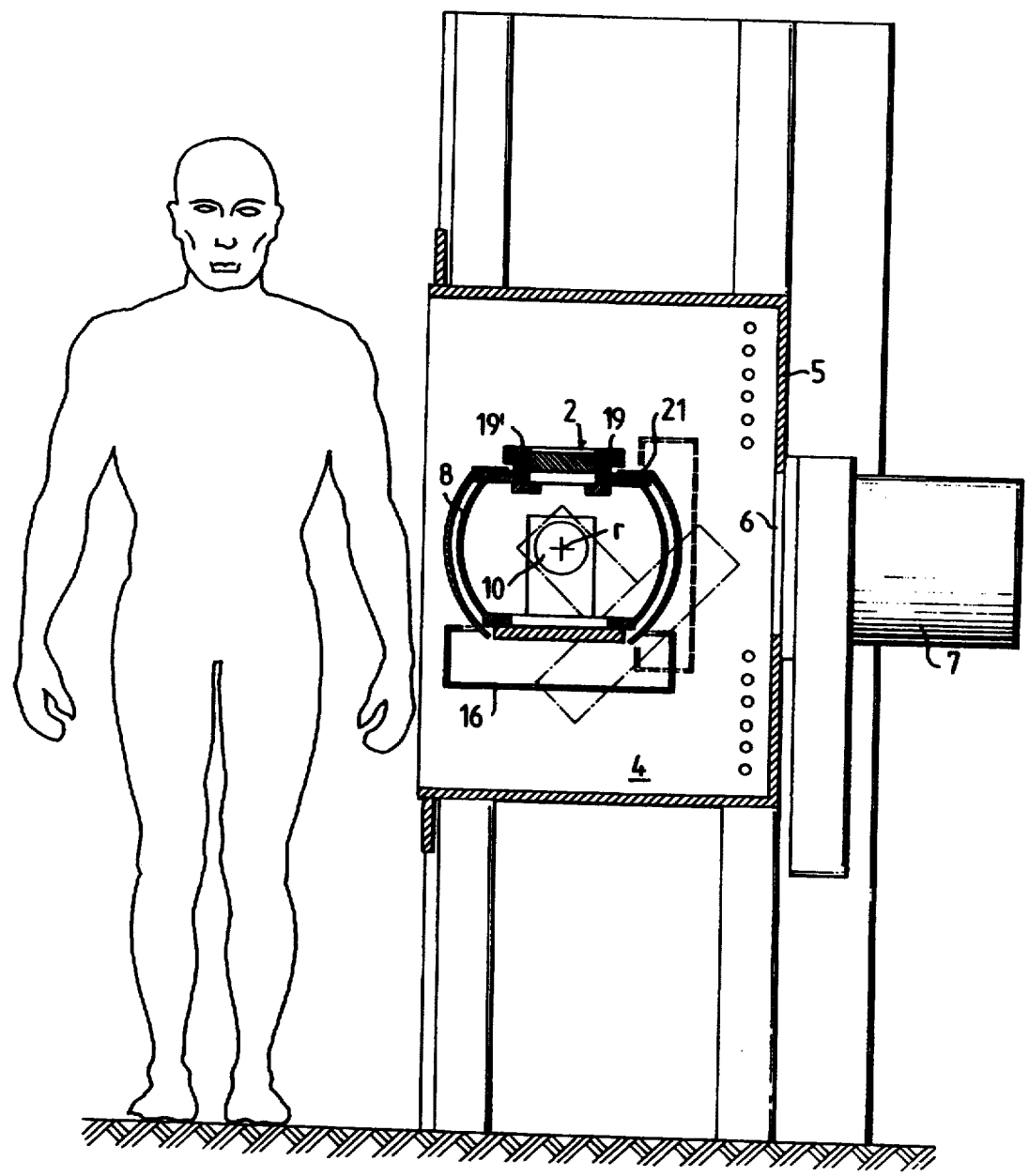
FIG. 4 is a section taken transversely through the coating apparatus but with the anode plate turned to a lower position.

Due to the fact that the structure 8 is in the form of a hollow cylindrical body whose interior communicates with the space surrounding the apparatus only via a longitudinal bore in the pivot shaft 10, the power input from an adaptation network (not shown) can be provided directly on the structure and the substrates 2 disposed thereon. When the structure 8 is in the position represented in FIG. 2 (after admitting an appropriate process gas into the vacuum chamber 4 and the space between the anode plate 16 and the substrate holder 8) an etching process can be performed. This requires connecting the anode 16 as a cathode and disconnecting the cathodes 17, 17'.

Referring to FIG. 6, the cathodes 17, 17' with their targets 18, 18' are directly opposite the substrates 2, so that a sputter coating process can take place. The rounded parts of the substrate holder 8 are shielded by the sheet-metal pieces 20, 20' which together act as a dark space shield and prevent the rounded parts of the hollow body 8 from becoming coated.

The horizontal arrangement of the structure 8 and axis r effectively prevents glitter that has formed in the environment of the substrates 2 or shields 20, 20' from landing on the substrates, which would degrade the quality of the sputtered coating.

The term glitter refers to coatings which form on the structure after long sputtering but are not firmly adhered. When several coatings build up on parts of the apparatus, tensions develop so that they may fall off.

The structure 8 can be rotated by means of the motor 15 to any desired position, so that installing or removing substrates can be done effortlessly and in any desired position.

We claim:

1. Apparatus for treating substrates, comprising a vacuum chamber,
   a rotatable structure mounted for rotation about a horizontal axis in said vacuum chamber, said structure having means for holding a plurality of substrates in a row which extends parallel to said axis of rotation,
   cathode means disposed adjacent said structure and parallel to said axis of rotation, and
   anode means disposed adjacent said structure opposite from said cathode means.

2. Apparatus as in claim 1 wherein said rotatable structure is a substantially cylindrical hollow body having opposed end faces provided with coaxial pivot shafts, said chamber being provided with coaxial journal means in which said pivot shafts are rotatably journaled.

3. Apparatus as in claim 2 wherein said pivot shafts have respective longitudinal bores therethrough and said hollow cylindrical body defines an interior space, said bores communicating between said interior space and a space outside said vacuum chamber.

4. Apparatus as in claim 1 wherein said rotatable structure is a substantially cylindrical hollow body having a cylindrical outer wall concentric to said axis of rotation, said cylindrical outer wall being provided with a first flat portion parallel to said axis of rotation, said means for holding a plurality of substrates comprising said first flat portion.

5. Apparatus as in claim 4 further comprising sheet metal shields mounted parallel to said cylindrical outer wall on both sides of said flat portion.

6. Apparatus as in claim 4 wherein said cylindrical outer wall is provided with a second flat portion mounted parallel to said axis of rotation and opposite from said first flat portion, said second flat portion being provided with a removable service plate.

7. Apparatus as in claim 1 wherein said vacuum chamber comprises a door mounted in a vertical plane parallel to the axis of rotation.

8. Apparatus as in claim 7 wherein said door is provided with an inspection window.

9. Apparatus as in claim 1 wherein said anode comprises a box structure which shields a portion of said rotatable structure, said structure being rotatable so that said means for holding substrates is shielded by said box structure.

10. Apparatus as in claim 1 wherein said anode means is rotatable about said axis of rotation.

11. Apparatus as in claim 1 wherein said cathode means and said anode means are both intersected by a horizontal plane passing through said axis of rotation.

12. Apparatus as in claim 1 wherein said cathode means comprises at least one planar target.

13. Apparatus as in claim 12 wherein said cathode means comprises a pair of planar targets defining planes which intersect at an obtuse angle opposite from said anode means.

14. Apparatus as in claim 7 wherein said cathode means is mounted on said door.

* * * * *